United States Patent
Bergmann

(10) Patent No.: US 7,616,453 B2
(45) Date of Patent: Nov. 10, 2009

(54) SUBASSEMBLY WITH AT LEAST TWO COMPONENT PARTS AS WELL AS A SEALING MODULE

(75) Inventor: Martin Bergmann, Schnaittenbach (DE)

(73) Assignee: Siemens Aktiengesellschaft, Munich (DE)

( * ) Notice: Subject to any disclaimer, the term of this patent is extended or adjusted under 35 U.S.C. 154(b) by 583 days.

(21) Appl. No.: 11/098,816

(22) Filed: Apr. 5, 2005

(65) Prior Publication Data

US 2005/0231931 A1 Oct. 20, 2005

(30) Foreign Application Priority Data

Apr. 14, 2004 (DE) .................. 10 2004 018 115

(51) Int. Cl.
*H05K 9/00* (2006.01)
(52) U.S. Cl. ..................... 361/816; 361/818
(58) Field of Classification Search ......... 361/801–802, 361/683–686; 174/51, 35 R
See application file for complete search history.

(56) References Cited

U.S. PATENT DOCUMENTS

| | | | |
|---|---|---|---|
| 4,943,686 A | | 7/1990 | Kucharek |
| 5,107,404 A | * | 4/1992 | Tam ........................... 361/818 |
| 5,239,446 A | | 8/1993 | Matsumura et al. |
| 5,529,088 A | * | 6/1996 | Asou ........................... 137/343 |
| 5,731,541 A | * | 3/1998 | Bernd et al. ................. 174/387 |
| 5,761,042 A | * | 6/1998 | Widmayer et al. .......... 361/704 |
| 5,883,785 A | * | 3/1999 | Rohrbeck et al. ........... 361/731 |
| 5,884,664 A | * | 3/1999 | Nagai et al. ................. 137/884 |
| 5,996,610 A | * | 12/1999 | Sato et al. ................... 137/271 |
| 6,147,877 A | * | 11/2000 | Strandberg et al. ......... 361/784 |
| 6,475,036 B2 | * | 11/2002 | Morikawa ................... 439/716 |
| 6,959,725 B2 | * | 11/2005 | Yoshino et al. ........ 137/505.25 |
| 7,245,497 B2 | * | 7/2007 | Klein et al. ................. 361/752 |
| 2002/0079653 A1 | | 6/2002 | Noguchi et al. |
| 2004/0047137 A1 | * | 3/2004 | Quero et al. ................ 361/807 |

FOREIGN PATENT DOCUMENTS

| | | |
|---|---|---|
| DE | 9321190 U1 | 2/1998 |
| FR | 2655809 A1 | 6/1991 |
| WO | WO 02/084918 A2 | 10/2002 |

* cited by examiner

*Primary Examiner*—Hung S Bui

(57) ABSTRACT

The invention relates to a Subassembly (1) with at least two component parts (2, 3), as well as a sealing module (4). To improve the exchangeability of seals (5, 6) for a subassembly comprising at least two component parts (2, 3), especially when complex seal geometries are involved, it is proposed that the subassembly (1) with at least two component parts (2, 3) which can be assembled to form the subassembly, features at least one sealing module (4) to accept at least one seal (5,6), which can be used between two component parts (2, 3) in each case.

19 Claims, 2 Drawing Sheets

SUBASSEMBLY WITH AT LEAST TWO COMPONENT PARTS AS WELL AS A SEALING MODULE

CROSS REFERENCE TO RELATED APPLICATIONS

This application claims priority to the German application No. 10 2004 018 115.2, filed Apr. 14, 2004 and which is incorporated by reference herein in its entirety.

FIELD OF INVENTION

The invention relates to a subassembly with at least two component parts which can be combined to form the subassembly, as well as to a sealing module.

BACKGROUND OF INVENTION

U.S. Pat. No. 5,239,446 A describes a waterproof housing for an electronic device. The housing consists of two housing parts and a housing cover. Seals are fitted between the first and second parts of the housing and between the second part of the housing and the housing cover. The first and the second housing part and the housing cover are rigidly attached to each other. The first housing part features a recess to accommodate a circuit board.

SUMMARY OF THE INVENTION

The object of the invention is to make it easier to replace seals for subassemblies consisting of at least two component parts, especially where the geometry of the seal is complex.

This object is achieved by the claims. The inventive subassembly features at least two component parts which can be fitted together to form the subassembly, with at least one sealing module to accommodate a seal, which can be fitted between the two component parts in each case, being provided.

The inventive sealing module is used to accommodate at least one seal and can be fitted between two component parts of a subassembly in each case.

Subassemblies with a housing designed in a higher protection class in particular are usually subjected to a variety of environmental conditions. Such environmental conditions are for example governed by fluids such as oil, acids, alkalis etc. or also by climatic conditions such as especially high or low temperatures. To withstand the widest diversity of environmental conditions, O-ring seals for the housing matched to the relevant environmental conditions are usually produced, said O-rings consisting of various materials. The advantage of O-rings is that they are easily exchangeable. On the other hand O-rings cannot be used for complex seal geometries since in such cases it would be very difficult if not impossible to fit the O-ring. When non-exchangeable seals have been used previously, it has been necessary to manufacture different housings for different environmental conditions with seals adapted to suit the conditions, with the complete housing having to be changed if necessary. The underlying idea behind the invention is to provide a separate sealing module to accept at least one seal, with the sealing module being able to be fitted between two component parts of a subassembly made up of component parts. In this way even complex seal geometries can be implemented. For the case in which the subassembly has to be exchanged, because of a failure for example, a new sealing module with a new set of seals can also be provided in each case.

If, in accordance with an advantageous embodiment of the invention, the sealing module is exchangeable, on the one hand the subassembly can be adapted to suit changing environmental conditions, on the other hand a subassembly can be provided with different sealing modules adapted the relevant application. Advantageously sealing modules with different seals can be used depending on the application.

The invention can be made easier to handle by the seal being fitted so that it is captive in the sealing module. In particular this offers advantages over previously used exchangeable seals, such as O-rings.

In accordance with a further advantageous embodiment of the invention the sealing module features electrical contact means for coupling with electrical contact means of the component parts.

In accordance with a further advantageous embodiment of the invention the component parts feature housing parts, with said housing parts being able to be assembled into a housing of the subassembly and the sealing module being provided for sealing the housing.

When the sealing module in accordance with a further advantageous embodiment of the invention features electronic components, exchanging the sealing module in the event that it becomes necessary to exchange these electronic components automatically also exchanges the seal.

The invention is described and explained in more detail below on the basis of the exemplary embodiments shown in the Figures.

DETAILED DESCRIPTION OF THE INVENTION

Figure 1:
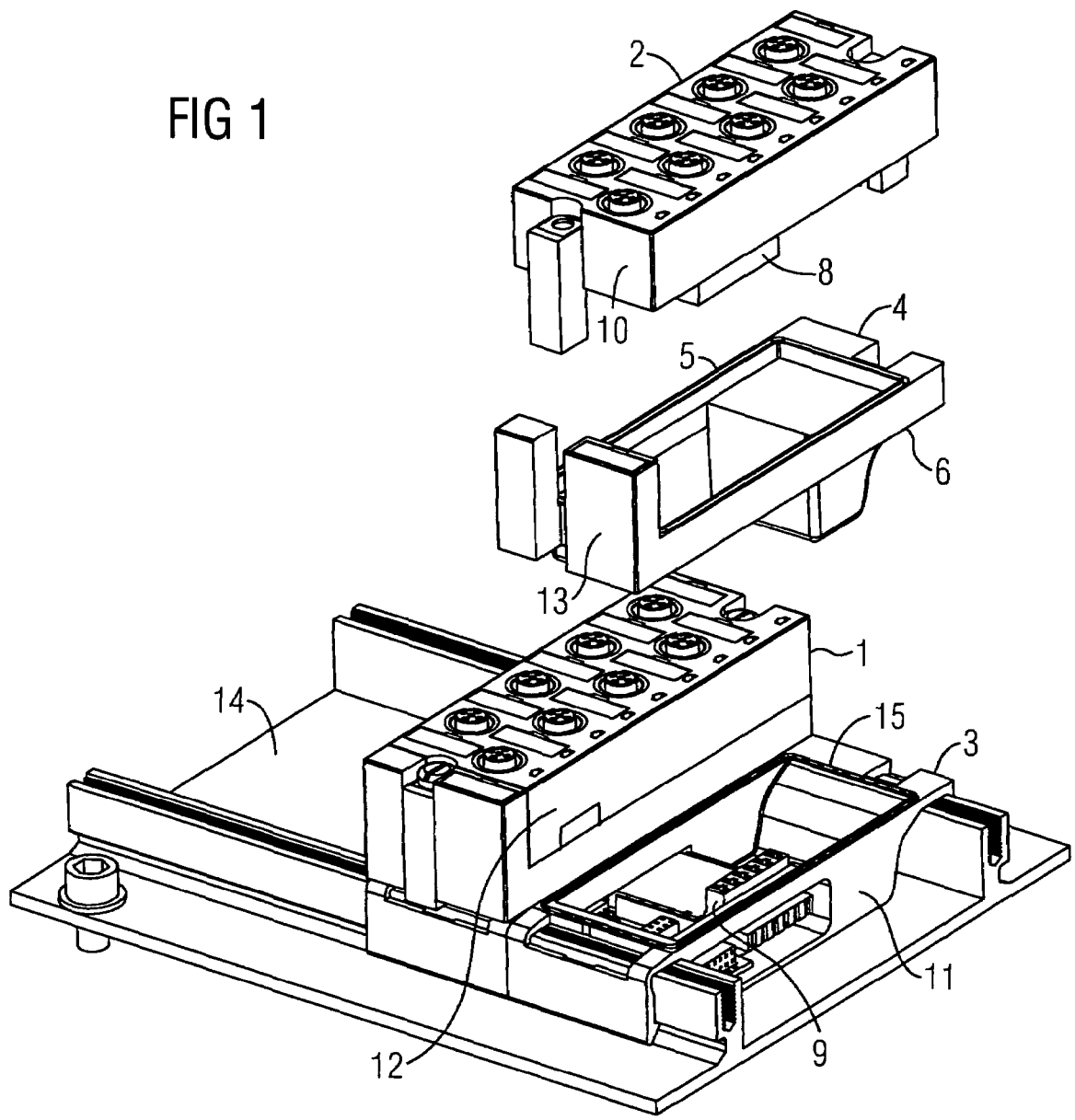
FIG. 1 shows a subassembly with two component parts, in the assembled and non-assembled state in each case.

FIG. 1 shows a electrical subassembly 1 with two component parts 2, 3, which can be fitted together to form subassembly 1. Such a subassembly 1 is for example a peripheral module of a Programmable Logic Controller for controlling an industrial automation system. Subassembly 1 according to the exemplary embodiment is provided for mounting on a mounting rack 14. Subassembly 1 is shown in both the assembled and the non-assembled state. The housing 12 of the assembled subassembly 1 is formed from the housing parts 10, 11, 13 of the component parts 2, 3 or of the sealing module 4. In the exemplary embodiment the first component part 2 is a basic module which can accommodate a circuit board with electronic components. The second component part 2 is embodied as a plug-in module used for connection of external lines. For electrical connection between plug-in module 2 and basic module 3 electrical contact means 8 or 9 are provided, which make contact with each other when the subassembly is in its assembled state. The seals for sealing the housing 12 of the subassembly 1 are not fitted to the component parts 2, 3 but in the separate sealing module 4. The sealing module 4 features the corresponding recesses on its upper or lower side for accepting the seals 5, 6. The seals 5, 6 are a captive fit in the sealing module 4. If necessary, for example if the environmental conditions in which the subassembly 1 is to be used change, sealing modules 4 adapted to the relevant environmental conditions equipped with the corresponding seals 5, 6 can be used. To exchange the seals 5, 6 the component parts 2, 3 do not have to be exchanged, merely the sealing module 4. The component parts 2, 3 feature means 15, e.g. grooves on which the relevant geometry of the seals 5, 6 are formed, so that in the assembled state of the subassembly 1 the relevant transition from component part 2 to sealing module 4 or from sealing module 4 to component part 3 is sealed. The sealing module 4 can be produced at low cost from plastic or metal for example. A further particular advantage of the invention lies in the fact that the component parts 2, 3 of the subassembly can be manufactured independent of the environment in which the subassembly 1 is to be used, since the seal required between the component parts 2, 3, to be made differently depending on the environmental conditions, is produced by the exchangeable sealing module 4 which can be manufactured with different seals 5, 6.

Figure 2:
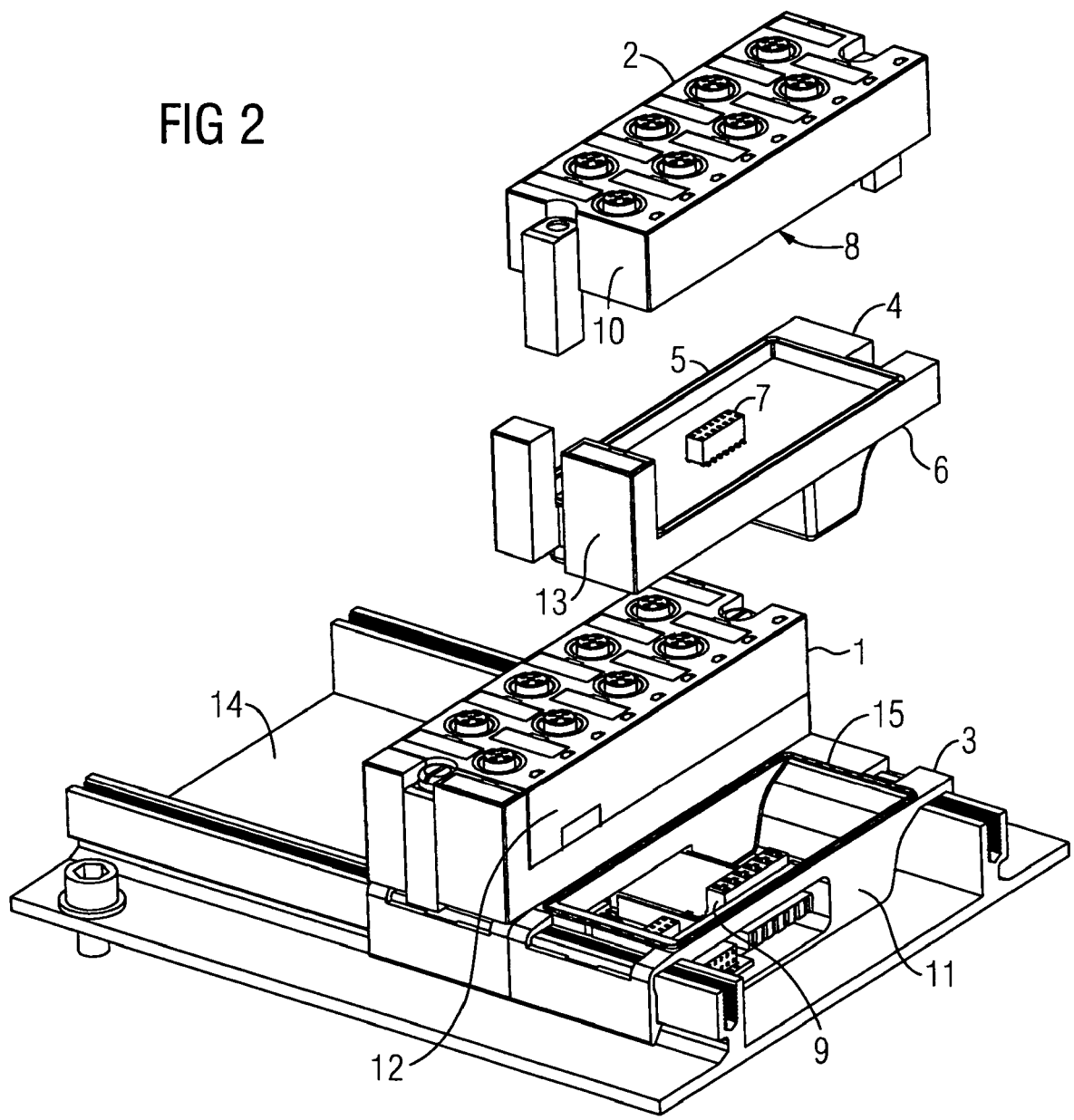
FIG. 2 shows a subassembly with two component parts, with the sealing module featuring electrical contact means.

FIG. 2 shows a further exemplary embodiment of the invention, with the sealing module 4 featuring electrical contact means 7 for coupling with the electrical contact means 8, 9 of the component parts 2, 3. The contact means 8 of the component part 2 are not directly visible in FIG. 2. Parts identified by the same reference symbol as those in FIG. 1 fulfill the same function in each case, as described in the description for FIG. 1.

Not shown is a further exemplary embodiment of the invention, in which the sealing module 4 features electronic components. Thus the sealing module 4 can contain a circuit board with all the electronic components necessary for the subassembly. For each exchange of the electronic components, resulting from a fault, expansion or upgrading of the electronics for example, the seal is then automatically exchanged along with the sealing module.

To summarize, the invention thus relates to a subassembly with at least two component parts 2, 3, as well as to a sealing module. To improve the exchangeability of seals 5, 6 for a subassembly comprising at least two component parts 2, 3, especially when complex seal geometries are involved, it is proposed that the subassembly with at least two component parts 2, 3 which can be assembled to form the subassembly, features at least one sealing module to accept at least one seal 5, 6, which can be used between two component parts 2, 3 in each case.

The invention claimed is:

1. A subassembly, comprising:
  two components which can be assembled to form the subassembly; with a first of the components providing a first electrical function and a second of the components providing a second electrical function; and
  a sealing module positioned between the first and second components effecting physical connection therebetween and providing one or more functions different from functions provided by the first and second components, one of said different functions including provision of a sealing function between the first and second components, wherein the sealing module includes a first recess for receiving a first seal and a second recess for receiving a second seal so that with a seal placed in each recess a sealed transition is provided between each component and the sealing module.

2. The subassembly in accordance with claim 1, wherein the sealing module is exchangeable.

3. The subassembly in accordance with claim 1, wherein the sealing module can accommodate different seals.

4. The subassembly in accordance with claim 1, wherein the seal is fitted captive in the sealing module.

5. The subassembly in accordance with claim 1, wherein the sealing module comprises electrical contacts for coupling with electrical contacts of the components.

6. The subassembly in accordance with claim 1, wherein the components parts have housing parts, wherein the housing parts can be assembled to form a housing of the subassembly, and wherein the sealing module is provided for sealing the housing.

7. The subassembly in accordance with claim 1, wherein the sealing module comprises an electronic component for performing a function different from functions provided by the first and second components.

8. A sealing module for accommodating a seal, wherein the sealing module comprises first and second seals affixed thereto, each of which can be arranged between the module and one of two components of a subassembly to effect a sealed transition between the module and each component, each component providing a different electrical function than the sealing module wherein the sealing module includes a first recess for receiving the first seal and a second recess for receiving the second seal so that with the seal placed in each recess the sealed transition is provided between each component and the sealing module.

9. The sealing module in accordance with claim 8, wherein each seal is fitted captive in the sealing module and each of the components provides an electrical function taken from the group consisting of an electrical circuit function and a connecting function for connection to external lines.

10. The sealing module in accordance with claim 8, further comprising electrical contacts for coupling with electrical contacts of the components.

11. The sealing module in accordance with claim 8, wherein the sealing module is provided for sealing a housing of the subassembly.

12. The sealing module in accordance with claim 8, further comprising electronic components.

13. A subassembly having at least two component parts, which can be assembled to form the subassembly, and at least one seating module positionable between the two component parts, the module including (i) a first seat formed thereon and positionable against a first of the components and (ii) a second seal formed thereon and positionable against a second of the components, wherein each component part provides an electrical function and the sealing module provides a function different than provided by the component parts wherein the sealing module includes a first recess for receiving the first seal and a second recess for receiving the second seal so that with the seal placed in each recess the sealed transition is provided between each component and the sealing module.

14. The subassembly in accordance with claim 13, wherein the sealing module is replaceable and the different function provided by the sealing module is a sealing function.

15. The subassembly in accordance with claim 13, wherein, depending on the application, seating modules with different seals can be used.

16. The subassembly in accordance with claim 13, wherein the seal is fitted undetachably in the sealing module.

17. The subassembly in accordance with claim 13, wherein the sealing module comprises electrical contact means for coupling with electrical contact means of the component pads.

18. The subassembly in accordance with claim 13, wherein the component parts feature housing parts, with the housing parts being assembled to form a housing of the subassembly and the sealing module being provided for sealing the housing.

19. The subassembly in accordance with claim 13, wherein the sealing module comprises electronic components.

* * * * *

UNITED STATES PATENT AND TRADEMARK OFFICE
CERTIFICATE OF CORRECTION

PATENT NO. : 7,616,453 B2　　　　　　　　　　　　　　　　　　　　Page 1 of 1
APPLICATION NO. : 11/098816
DATED : November 10, 2009
INVENTOR(S) : Martin Bergmann It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 559 days.

Signed and Sealed this

Nineteenth Day of October, 2010

David J. Kappos
*Director of the United States Patent and Trademark Office*